(12) United States Patent
Ito et al.

(10) Patent No.: US 7,345,552 B2
(45) Date of Patent: Mar. 18, 2008

(54) CONSTANT TEMPERATURE TYPE CRYSTAL OSCILLATOR

(75) Inventors: Manabu Ito, Saitama (JP); Minoru Fukuda, Saitama (JP); Tetuo Kudo, Saitama (JP); Takeshi Uchida, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/129,959

(22) Filed: May 16, 2005

(65) Prior Publication Data

US 2005/0258913 A1 Nov. 24, 2005

(30) Foreign Application Priority Data

May 19, 2004 (JP) .............................. 2004-148797
May 27, 2004 (JP) .............................. 2004-157072

(51) Int. Cl.
*H03B 1/02* (2006.01)
*H03B 5/04* (2006.01)

(52) U.S. Cl. ............................ 331/69; 331/66; 331/70; 331/158; 331/176

(58) Field of Classification Search .................. 331/65, 331/66, 70, 69, 68, 116 FE, 158, 175, 176, 331/116 R; 310/343
See application file for complete search history.

(56) References Cited

U.S. PATENT DOCUMENTS 3,719,860 A * 3/1973 Lawrence .................... 361/703
5,146,044 A * 9/1992 Kurokawa et al. ........ 102/202.5
5,703,542 A 12/1997 Blandino et al.
6,208,213 B1 * 3/2001 Anastasyev et al. ........... 331/69
2004/0060925 A1 * 4/2004 Zhou et al. .................. 219/543

FOREIGN PATENT DOCUMENTS

| EP | 0 994 563 A2 | 4/2000 |
| EP | 0 994 563 A3 | 8/2000 |
| JP | HEI 01-195706 | 8/1989 |

OTHER PUBLICATIONS

European Search Report issued Oct. 4, 2005.
Office Action issued by the European Patent Office on Jun. 23, 2006.

* cited by examiner

*Primary Examiner*—Robert J. Pascal
*Assistant Examiner*—Ryan J Johnson
(74) *Attorney, Agent, or Firm*—Scott D. Wofsy; Edwards Angell Palmer & Dodge LLP

(57) ABSTRACT

A lead wire led-out type crystal oscillator of constant temperature type for high stability is disclosed, which includes a heat supply body that supplies heat to a crystal resonator from which a plurality of lead wires are led out, to maintain the temperature constant. The heat supply body includes a heat conducting plate which has through-holes for the lead wires and is mounted on the circuit board, and which faces, and is directly thermally joined to, the crystal resonator and a chip resistor for heating which is mounted on the circuit board adjacent to the heat conducting plate, and is thermally joined to the heat conducting plate.

10 Claims, 5 Drawing Sheets

CONSTANT TEMPERATURE TYPE CRYSTAL OSCILLATOR

BACKGROUND OF THE INVENTION

The present invention relates to a highly stable crystal oscillator of lead wire led-out type and constant temperature type (hereunder referred to as highly stable oscillator), and particularly relates to a highly stable oscillator which is effective in heat utilization The frequency stability of this kind of highly stable oscillator is high, since the operating temperature of a crystal resonator is maintained constant by a thermostat. Therefore, a highly stable oscillator of this kind is used industrially in optical communication base stations for example. Recently, miniaturization has spread even to these highly stable oscillators, and corresponding miniaturization has been required.

FIG. 2A and FIG. 2B are diagrams describing one conventional example of a lead wire led-out type crystal oscillator of this kind. FIG. 2A is a vertical sectional view of the highly stable oscillator, and FIG. 2B is a perspective view of the lead wire led-out type crystal resonator used therefor.

As shown in FIG. 2A, the highly stable oscillator of this kind comprises a first circuit board 1a and a second circuit board 1b. The first circuit board 1a is supported by metallic pins 3a serving as external terminals which are insulated from and pass through a metallic base 2. A thermostat 4 and temperature control elements 5 are arranged so as to construct a temperature control mechanism that maintains the temperature of the thermostat 4 constant. The thermostat 4 comprises a metallic cylinder having one open end. A heating coil 6 is wound around the periphery thereof, and a thermistor 5a is fitted as a temperature detection element. Moreover, the thermostat 4 is secured on a power transistor 5b used for electricity control, which is disposed on the first circuit board 1a.

The second circuit board 1b is supported by metallic pins 3b placed on the first circuit board 1a, and blocks off an upper opening face of the thermostat 4. Moreover a crystal resonator 7 and oscillating elements 8 are disposed on both opposite principal planes of the second circuit board 1b, thereby constructing an oscillating circuit. This oscillating circuit is a voltage control type, having a voltage-variable capacitive element 8a for example.

As shown in FIG. 2B, the crystal resonator 7 of this kind of crystal oscillator comprises for example an AT cut or SC cut crystal piece 7b sealed off inside a metallic container 7a (TO5 type) with five lead wires 9 leading out from its bottom. This crystal piece 7b is retained inside the metallic container 7a while maintaining its plate face horizontal, and is employed as a highly stable oscillator, particularly for communication equipment.

The lead wires 9 of the crystal resonator 7 pass through the second circuit board 1b and are secured thereon by soldering, and the metallic container 7a of the crystal resonator 7 disposed on the one principal plane is accommodated in the thermostat 4. Furthermore, the highly temperature-dependent oscillating elements 8, the characteristics of which fluctuate according to the temperature of voltage-variable capacitive elements 8a and the like, are disposed on the other principal plane of the second circuit board 1b, and are accommodated in the thermostat 4. Then they are covered with a metallic cover 10.

According to such a conventional highly stable oscillator, the operating temperature of the crystal resonator 7 is kept constant by the thermostat 4, so that frequency fluctuations in the oscillation frequency due to temperature variations can be prevented. In other words, fluctuations in the oscillating frequency based on the frequency temperature characteristics of the crystal resonator 7 can be prevented. Moreover, since the second circuit board 1b mounted with the oscillating elements 8 is disposed on the thermostat 4, frequency fluctuations due to the temperature characteristics of the circuit elements themselves are also prevented. Since highly temperature-dependent, highly heat sensitive elements such as in particular the voltage-variable capacitive elements 8a are accommodated inside the thermostat 4, the highly stable oscillator can further increase the frequency stability, for example can maintain a frequency deviation of 0.05 ppm or less. Therefore, the highly stable oscillator is employed particularly for industrial purposes.

Moreover, with the conventional highly stable oscillator, the temperature control mechanism including the thermostat 4 is disposed on the first circuit board 1a, and an oscillating circuit including the crystal resonator 7 is disposed on the second circuit board 1b. Therefore, the temperature control mechanism and the oscillating circuit can be manufactured separately, and hence their design and manufacture can be facilitated. Furthermore, the oscillating elements 8 are mounted on the second circuit board 1b, and are electrically connected to the first circuit board 1a by the metallic pins 3b. Here, the first circuit board 1a is not directly led out externally, and hence heat dissipation to the outside can be prevented (see Japanese Unexamined Patent Publication KOKAI No, Hei 01-195706).

However, since the temperature control mechanism and the oscillating circuit are separately manufactured for the conventional highly stable oscillator of the above construction, the first circuit board 1a and the second circuit board 1b are necessary. Furthermore, since the thermostat 4 that accommodates the crystal resonator 7 is used, an increase in the size of the oscillator cannot be avoided. In particular, since the first circuit board 1a and the second circuit board 1b are arranged so that they are vertically opposed to each other, there has been a problem of an increase the height dimension of the oscillator itself.

Moreover, the oscillator also has had a problem in that the oscillator itself becomes expensive since the thermostat 4 with the heating coil 6 wound therearound is used separately from the crystal resonator 7. There is an oscillator that uses the metallic container 7a of the crystal resonator 7 also for the thermostat 4. However, in either case, there has been a problem in that the manufacturing operation becomes troublesome, and the oscillator itself becomes more expensive because of a need for winding the heating coil 6 around the thermostat 4.

An object of the present invention is to provide a highly stable oscillator, the structure of which is simpler, and in particular, which is of reduced height dimensions.

Moreover, the present invention relates to a constant temperature type crystal oscillator that uses a surface mounted crystal resonator (SMD: abbreviation of Surface Mounted Device), and particularly relates to a constant temperature type crystal oscillator having a simple structure.

FIG. 6 is a diagram for explaining one example of a conventional surface mounted crystal oscillator of this kind, wherein FIG. 6A is a vertical sectional view of a constant temperature type crystal oscillator, and FIG. 6B is a schematic diagram showing a crystal oscillator inserted into a thermostat.

A crystal oscillator of this kind comprises; a crystal resonator 22, a thermostat 23, oscillating elements 24, and temperature control elements 25 disposed on a first circuit board 21a and a second circuit board 21b. The first circuit board 21a is supported by metallic pins 27a (hermetic terminals) serving as external terminals which are insulated from, and pass through, a metallic base 26. The second circuit board 21b is supported by metallic pins 27b implanted on the first circuit board 21a. Both the first circuit board 21 and the second circuit board 21b are composed of glass epoxy material.

The crystal resonator 22 comprises for example, an AT cut or SC cut crystal piece sealed off inside a metallic case 29, shown in FIG. 6B, with a pair of lead wires 28 leading out. The thermostat 23 is formed with a metallic cylinder 30 having a heating wire 31 wound therearound, and accommodates the crystal resonator 22 as also shown in FIG. 6A. Moreover, the principal plane of the metallic cylinder 30 is placed so as to face one principal plane of the second circuit board 21b, and both of these are thermally joined by a thermo-conductive resin 32. Furthermore, a pair of lead wires 28 of the crystal resonator 22 are bent and connected to the second circuit board 21b.

The oscillating elements 24 constitute an oscillation circuit together with the crystal resonator 22, and are disposed on the other principal plane of the second circuit board 21b. The temperature control elements 25 include at least a thermistor 25a as a temperature sensitive element, and together with power transistors, construct a temperature control circuit that controls the temperature of the thermostat 23. The members apart from the thermistor 25a are disposed on the peripheral edge of the first circuit board 21a. In this temperature control circuit the temperature of the thermostat 23 is detected for example by joining the thermistor 25a to the thermostat 23. Then, based on this detected temperature, the power to be supplied to the heating coil 31 is controlled to maintain the temperature inside the thermostat 23 constant. A metallic cover 33 covers these members.

According to such a crystal oscillator, the operating temperature of the crystal resonator 22 can be controlled to be constant by the thermostat 23, so that frequency fluctuations of the oscillation frequency due to temperature variation can be prevented. In other words, fluctuations in the oscillating frequency based on the frequency temperature characteristics of the crystal resonator 22 can be prevented. Moreover, since the second circuit board 21b mounted with the oscillating elements 24 is disposed on the thermostat 23, frequency fluctuations due to the temperature characteristics of the circuit elements themselves can be prevented.

However, as shown in FIG. 6B, since the crystal oscillator of the above construction uses the crystal resonator 22 in which a crystal piece is accommodated in the metallic case 29 that has lead wires 28 leading out externally, there is an increase in the size of the crystal oscillator itself. Moreover, since the thermostat 23 with the heating coil 31 wound therearound is used, the crystal oscillator itself becomes more expensive and its structure becomes more complex. There is also an oscillator in which the metallic container 29 of the crystal resonator 22 has the heating coil 31 directly wound therearound. However, even in this case, an operation for winding the heating coil 31 on the thermostat 23 is required, and hence in either case there is a problem of increased complexity of the structure.

Moreover, these crystal oscillators are employed for use in a base station, as having a frequency stability of 0.05 ppm or less as described earlier. However, since for example, GMS purpose requires comparatively moderate frequency stability of 0.1 to 0.2 ppm or less, there have been instances of over specification. In light of this, application of a temperature compensated crystal oscillator for surface mounting may be considered. However, in this case frequency stability becomes approximately 1 ppm, and hence there is a problem in that it can not satisfy predetermined standards.

An object of the present invention is to provide a constant temperature type crystal oscillator in which miniaturization is advanced, and the structure is simplified.

SUMMARY OF THE INVENTION

The present invention is one where, in a lead wire led-out type crystal oscillator of constant temperature type for high stability, comprising: a heat supply body that supplies heat to a crystal resonator from which a plurality of lead wires are led out, to maintain the temperature constant; an oscillating element that constitutes an oscillating circuit together with the crystal resonator; a temperature control element that constitutes a temperature control circuit for controlling the temperature of the crystal resonator; and a circuit board for mounting the heat supply body, the oscillating element, and the temperature control element, and through which lead wires of the crystal resonator are passed through for mounting, the heat supply body comprises: a heat conducting plate which has through-holes for the lead wires and is mounted on the circuit board, and which faces, and is directly thermally joined to, the crystal resonator; and a chip resistor for heating which is mounted on the circuit board adjacent to the heat conducting plate, and is thermally joined to the heat conducting plate.

According to such a construction, the heat conducting plate is heated by the chip resistor provided on the circuit board upon which the oscillating element and the temperature control element are mounted, and the crystal resonator faces these and is directly thermally joined to both items. Therefore a thermostat becomes unnecessary and only a single circuit board is required. As a result, the structure can be simplified, and in particular the height dimension of the oscillator itself can be reduced.

In the present invention, the heat conducting plate has first concavities on one pair of opposite end sides, and the chip resistors that have been thermally joined to the heat conducting plate are disposed in the first concavities. As a result, the chip resistors are disposed in geometrically stable symmetric positions, and the heat conducting plate can be heated uniformly.

Moreover, in the present invention there are second concavities in an other pair of opposite end sides of the heat conducting plate, and power transistors that have been thermally joined to the heat conducting plate are disposed in the second concavities. As a result, the heating bodies (chip resistors and power transistors) are disposed above, below, left, and right of the heat conducting plate, and the heat conducting plate can be heated even more uniformly. Moreover, by using the heat of the power transistors, power consumption of the chip resistors can be reduced.

Furthermore, in the present invention, an aperture part is formed in the center area of the heat conducting plate, and a highly temperature-dependent, highly heat sensitive element, among the oscillating element and the temperature control element, is disposed inside said aperture part so that it is thermally joined to the heat conducting plate. As a result, the temperature dependency of the highly heat sensitive element can be resolved, and stable characteristics can be obtained.

Moreover, in the present invention, the heat conducting plate is thermally joined to one principal plane of the circuit board, and the oscillating element is disposed on the other principal plane of the circuit board, which faces the heat conducting plate. As a result, temperature characteristics of the oscillating element can be made constant, and oscillating frequency can be made more stable.

Furthermore, in the present invention, the thermal joining is carried out by thermo-conductive resin. As a result, for example adhesion between the crystal resonator and the heat conducting plate can be improved, and efficient heat conduction can be achieved.

In the present invention, a cut out is provided which passes through the circuit board, and is peripheral to the heat conducting plate. As a result, the heat conducting plate and the circuit board at the periphery thereof are thermally separated, and heat dissipation is prevented.

Moreover, the present invention is a constant temperature type crystal oscillator which uses a surface mounting crystal resonator, in which a surface mounting crystal resonator is mounted on the circuit board together with an oscillating element and a temperature control element, and the construction is such that the crystal resonator is arranged on a ceramic substrate, and at least a chip resistor for heat generation, and a highly temperature-dependent highly heat sensitive element are arranged on the ceramic substrate.

According to such a construction, the crystal resonator is made for surface mounting, and the chip resistor for heating is disposed on the ceramic substrate. Therefore, a constant temperature type crystal oscillator in which miniaturization is expedited and with a simplified structure can be obtained. Moreover, since a highly heat sensitive element is arranged on the ceramic substrate, if this is a temperature sensitive element for example, heating temperature can be directly detected. Furthermore, if this as an oscillating element, its temperature dependency can be resolved.

The crystal resonator of the crystal oscillator of the present invention is arranged on one principal plane of the ceramic substrate, and the chip resistor and the temperature sensitive element are arranged on the other principal plane of the ceramic substrate. As a result, the chip resistor can be disposed facing the crystal resonator, and the heat efficiency can be improved. Also, the chip resistor is disposed adjacent to the temperature sensitive element, so that the heat generation temperature can be directly detected.

In the crystal oscillator of the present invention, the crystal resonator is arranged on one principal plane of the ceramic substrate, and the chip resistor and the temperature sensitive element are arranged on the other principal plane of the ceramic substrate, and the other principal plane of the ceramic substrate is positioned facing one principal plane of the circuit board, and thermo-conductive resin is provided between the chip resistors and the circuit board, thereby adhering them. As a result, heat from the chip resistor can be efficiently transmitted to the circuit board, by the thermo-conductive resin.

In the crystal oscillator of the present invention, an oscillating element that constitutes an oscillating circuit is arranged on the other principal plane of the circuit board, which faces the ceramic substrate. As a result, heat is transmitted to the oscillating element to make the temperature uniform. Therefore, fluctuations in the oscillating element characteristics due to the temperature characteristics can be prevented.

In the present invention, the highly heat sensitive element is either a temperature sensitive element or a voltage-variable capacitive element. As a result, heat generation temperature of the chip resistor can be directly detected. Moreover, fluctuations in capacity due to temperature can be prevented, and a voltage controlled oscillator of stable oscillating frequency with respect to control voltage can be achieved.

In the crystal oscillator of the present invention, the circuit board is retained on the another circuit board for surface mounting by metallic pins. As a result, a constant temperature type crystal oscillator for surface mounting can be obtained, and a further miniaturization is expedited.

BRIEF DESCRIPTION OF THE DRAWINGS

FIG. 1 is a diagram for explaining one embodiment of a highly stable oscillator of lead wire led-out type of the present invention, wherein

FIG. 2 is a diagram for explaining a conventional highly stable oscillator of lead wire led-out type, wherein

FIG. 3 is a diagram for explaining one embodiment of a surface mounted crystal oscillator of the present invention, wherein

FIG. 6 is a diagram for explaining a conventional surface mounted crystal oscillator, wherein

DETAILED DESCRIPTION OF THE PREFERRED EMBODIMENTS

Embodiment

Lead Wire Led-out Type Crystal Oscillator

Figure 1A:
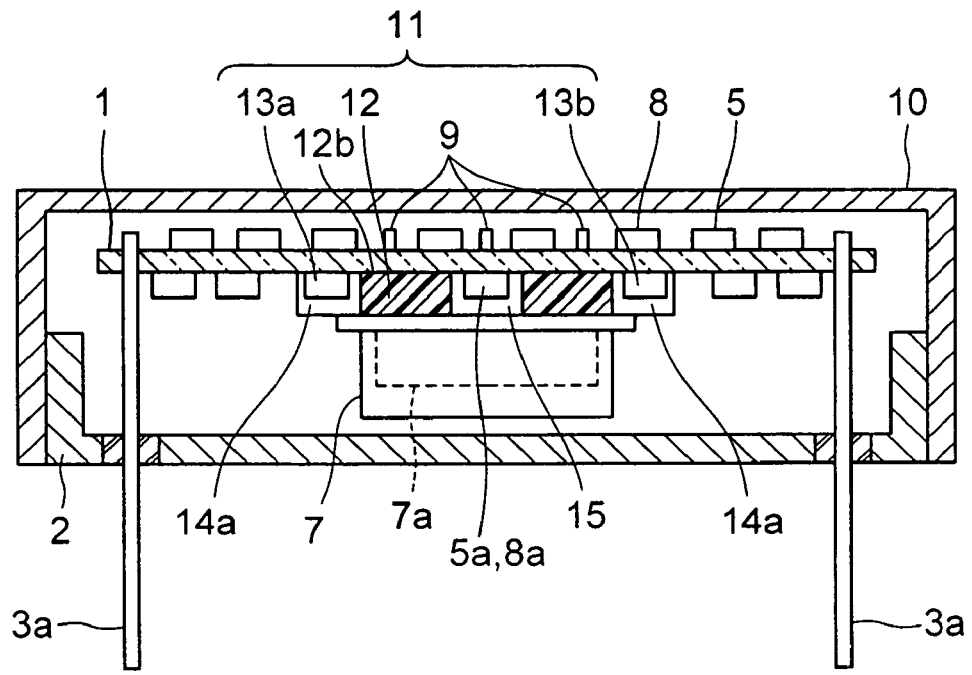
FIG. 1A is a vertical sectional view thereof.
Figure 1B:
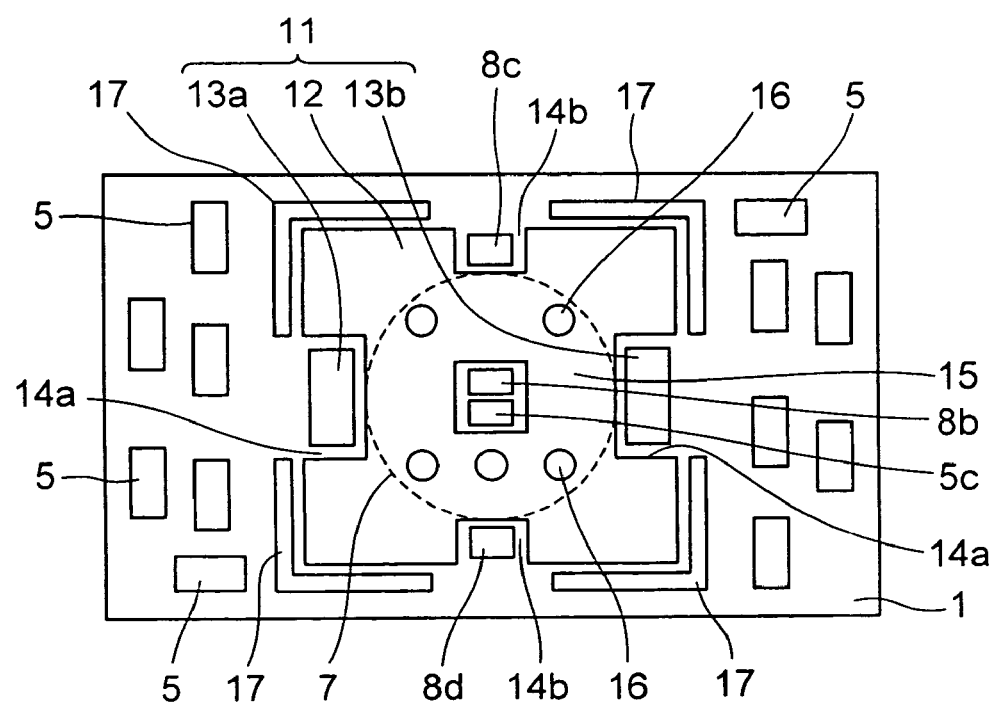
FIG. 1B is a plan view of the main points.
Figure 2A:
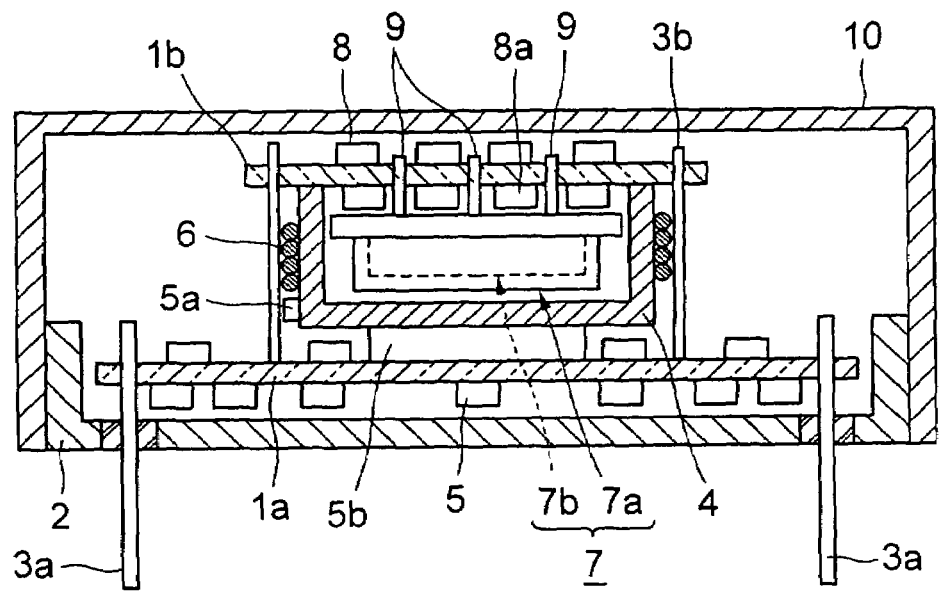
FIG. 2A is a partial vertical sectional view thereof.
Figure 2B:
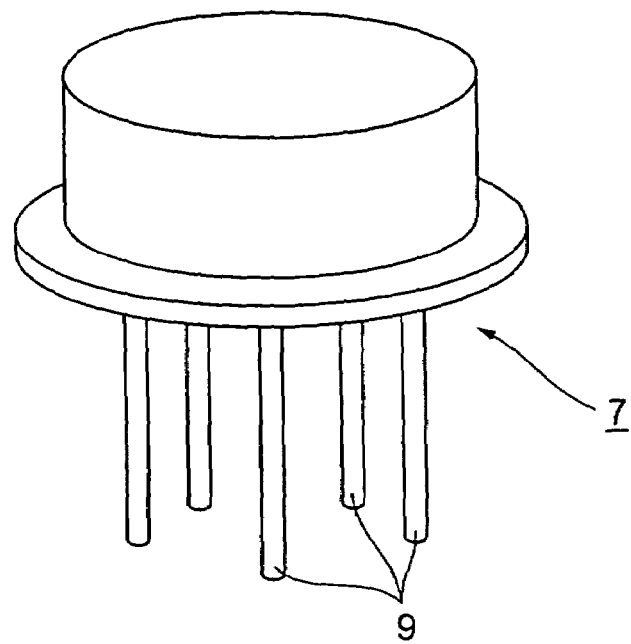
FIG. 2B is a perspective view of a container (hat shape) accommodating a crystal oscillator.

FIG. 1 is a diagram for explaining one embodiment of a highly stable oscillator of lead wire led-out type of the present invention, wherein FIG. 1A is a partial vertical sectional view thereof, and FIG. 1B is a plan view of the main points.

The highly stable oscillator of the present invention comprises a constant temperature type crystal oscillator in which the operating temperature of a crystal resonator is constant. Here, as shown in FIG. 1A, this highly stable oscillator is constructed with an oscillating element 8 including a crystal resonator 7 (a crystal piece 7a), and temperature control elements 5, mounted on a single circuit board 1, and a heat supply body 11 attached thereto. The heat supply body 11 comprises a heat conducting plate 12, and chip resistors 13a and 13b for heating. Here a power transistor of the temperature control element 5 is also used for heating.

The heat conducting plate 12 comprises an aluminum plate of for example a square shape in plan view, and as shown in FIG. 1B, has a first pair of concavities 14a on opposite end sides, a second pair of concavities 14b on opposite end sides orthogonal thereto, and an aperture part 15 in its center area. The opposite end sides are positioned on concentric circles having the center area as their center.

Through-holes 16 through which lead wires 9 of the crystal resonator 7 pass, are provided on the peripheral edge of the aperture part 15. Moreover, the four corners of the heat conducting plate 12 are fastened to the circuit board 1 with screws. In the present embodiment, a thermo-conductive resin 12b is coated between the circuit board 1 and the heat conducting plate 12, to thermally join them. Furthermore, hook-shaped cut outs 17 that pass completely through the circuit board 1, are provided opposite the four corners of the heat conducting plate 12.

The chip resistors 13a and 13b are provided as two, serving as heater resistors using joule heat, and are respectively disposed in the first pair of concavities 14a of the heat conducting plate 12 mounted on the circuit board 1. Also, power transistors 8c and 8d used for heating, are respectively disposed in the second concavities 14b on the heat conducting plate 12. All of the terminals thereof are disposed adjacent to the periphery of the heat conducting plate 12 by means of soldering. A thermo-conductive resin is coated so as to cover the chip resistors 13a and 13b, and the power transistors 8c and 8d. In this case, the thermo-conductive resin is also coated on the heat conducting plate 12, so the chip resistors 13a and 13b, and the power transistors 8c and 8d are thermally joined to the heat conducting plate 12.

The crystal resonator comprises a crystal piece 7a sealed off inside a TO8 type a crystal resonator 7 covered by a metallic container having five lead wires 9 leading out therefrom. Each lead wire 9 of the crystal resonator 7 passes through the through-holes in the heat conducting plate 12 and the circuit board 1, and is secured by soldering. In this case, the dimensions of the through-holes 16 in the heat conducting plate 12 are to be made greater than those of the through-holes in the circuit board 1, so that the lead wires 9 and the heat conducting plate 12 are electrically insulated. Moreover, the bottom of the crystal resonator 7 and the heat conducting plate 12 are facing opposed to each other, and are directly thermally joined by a thermo-conductive resin coating therebetween, and are mounted on one principal plane of the circuit board 1.

Among the oscillating elements 8 and the temperature control elements 5, a voltage-variable capacitive element 8a and a thermistor 5a, which are highly heat sensitive elements, are disposed as shown in FIG. 1B in the aperture part 15 provided in the central area of the heat conducting plate 12, and are thermally joined to the heat conducting plate 12 by a thermo-conductive resin. Other oscillating elements 8 other than the highly heat sensitive elements (8a, 5a) are disposed on the other principal plane of the circuit board 1 opposed on the other side to the heat conducting plate 12, and the temperature control elements 5 are arranged and mounted on the peripheral edges of both principal planes of the circuit board 1.

According to such construction, the heat conducting plate 12 can be heated by the chip resistors 13a and 13b provided on the circuit board 1, upon which the oscillating elements 8 and the temperature control elements 5 are mounted. Furthermore, since the bottom of the metallic container that accommodates the crystal resonator 7 is directly thermally joined to the opposing heat conducting plate 12, a thermostat is unnecessary, and the circuit board 1 can be constructed from a single substrate. Therefore the construction can be made simple, and overall, in particular the height dimension of the crystal oscillator, can be made small.

Moreover, the chip resistors 13a and 13b that have been thermally joined in the first concavities 14a provided on the opposite end sides of the heat conducting plate 12, are disposed on the heat conducting plate 12. Therefore, the chip resistors 13a and 13b are in geometrically stable symmetric positions, and the heat conducting plate 12 can be uniformly heated. Furthermore, the power transistors 8c and 8d that have been thermally joined to the heat conducting plate 12, are disposed in the second concavities 14b provided on the opposite end sides orthogonal to the first concavities 14a of the heat conducting plate 12. Therefore, the heating bodies (the chip resistors 13a and 13b, and the power transistors 8c and 8d) are disposed above, below, left, and right of the heat conducting plate 12, and hence the heat conducting plate 12 can be even more uniformly heated. Moreover, by using the heat of the power transistors 8c and 8d, electrical power consumption of the chip resistors 13a and 13b can be reduced.

Also, the aperture part 15 is provided in the center area of the heat conducting plate 12, and of the oscillating elements 8 and the temperature control elements 5, the voltage-variable capacitive element 8a and the thermistor 5a, which are highly temperature-dependent highly heat sensitive elements, are thermally joined to the heat conducting plate 12 and disposed in the aperture part 15. As a result, the temperature dependency of the highly heat sensitive elements can be resolved, and stable characteristics can be obtained. Furthermore, the heat conducting plate 12 is thermally joined to one principal plane of the circuit board 1, and the oscillating elements 8 are disposed on the other principal plane of the circuit board 1, which is on the opposite side. Therefore, the temperature characteristics of the oscillating elements 8 can be made constant, and the oscillating frequency can be further stabilized.

Moreover, since thermal joining of the crystal resonator 7 and the heat conducting plate 12 is achieved by having thermo-conductive resin in between them for example, they have good adhesion, and heat conduction is made more efficient. Furthermore, since the cut outs 17 are provided in the parts of the circuit board 1 positioned on the peripheral edge of the heat conducting plate 12, the heat conducting plate 12 and the parts of the circuit board 1 positioned on the peripheral edge thereof are thermally separated, thus preventing heat dissipation.

In the above embodiment, the crystal resonator 7 can be applied to a TO8 type having five lead wires leading out. Moreover, the chip resistors 13a and 13b and the power transistors 8c and 8d are respectively two in number. However the number may be increased or reduced as necessary. Also, a single chip resistor 13 may be used.

Furthermore, the aperture part 15 provided in the center area of the heat conducting plate 12 may be substituted by the pair of concavities 14a and 14b provided on opposite ends of the heat conducting plate 12. Alternatively, these concavities and the aperture part may be omitted, and a chip resistor 14 or the like may be simply provided on the periphery edge of the heat conducting plate 12 having a square shape in plan view. Moreover, here for example the thermo-conductive resin is used for thermally joining the heat conducting plate 12 and the crystal resonator 7a. However instead, a molten resin may be coated and cured, or a pre-cured sheet may be used. Moreover, since thermal joining is dependent on the degree of adhesion of both parts, the thermo-conductive resin may not be deemed necessary.

Surface Mounted Crystal Oscillator

Figure 3A:
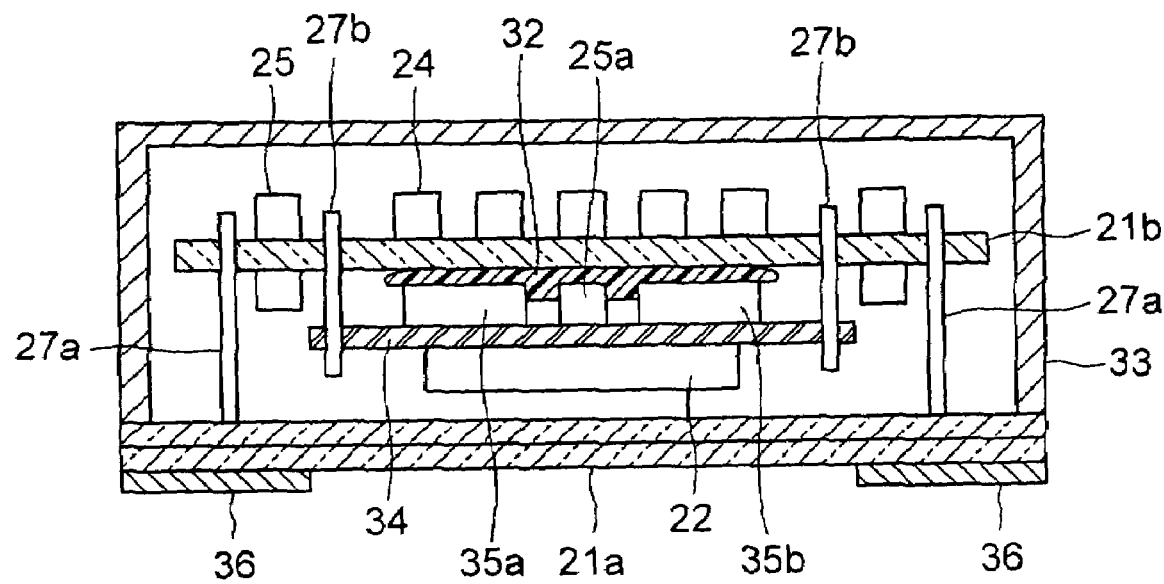
FIG. 3A is a vertical sectional view of a constant temperature type surface mounted crystal oscillator.
Figure 3B:
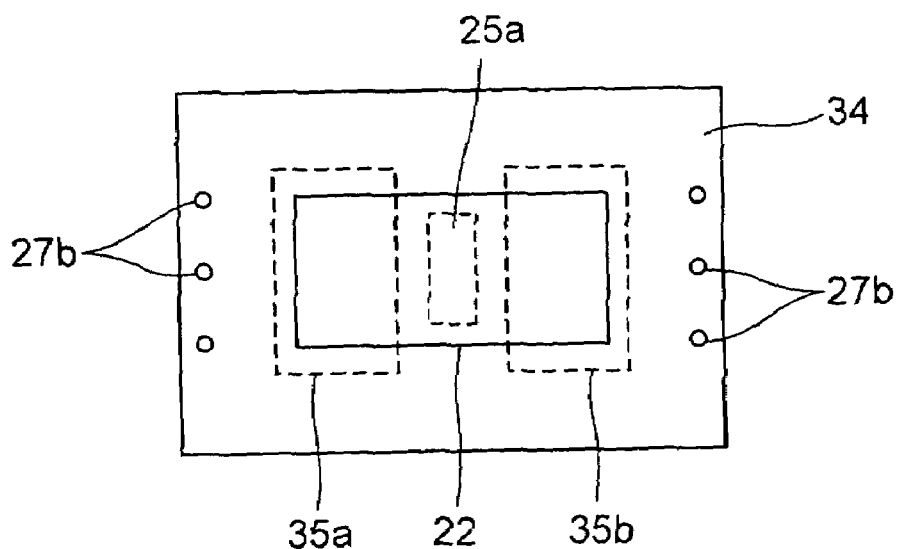
FIG. 3B is a plan view of a ceramic substrate.

FIG. 3 is a diagram for explaining one embodiment of a surface mounted crystal oscillator of the present invention, wherein FIG. 3A is a vertical sectional view of a constant temperature type crystal oscillator, and FIG. 3B is a plan view of a ceramic substrate (seen from the back side of the crystal oscillator) used for the crystal oscillator of the present invention.

First of all, as shown in FIG. 3A, the surface mounted crystal oscillator of the present invention is provided with a first circuit board 21a, and a second circuit board 21b formed from glass epoxy. The first circuit board 21a comprises a multilayer substrate, and is provided with a circuit pattern in its multilayer plane, and has mounting terminals 36 for surface mounting, on its outer surface. A thermo-conductive ceramic substrate 34 that is held by metallic pins 27b, is provided on one principal plane of the second circuit board 21b. Moreover, oscillating elements 24 that constitute an oscillator circuit are arranged in the central area of the other principal plane, and temperature control elements 25 that constitute a temperature control circuit are arranged on the peripheral part thereof.

A crystal resonator 22 for surface mounting is arranged on one principal plane of the ceramic substrate 34. This surface mounted resonator 22 has a crystal piece sealed off inside a ceramic container, and has a mounting terminal for example on the bottom face of a rectangular part. Two chip resistors 35a and 35b for heat generation are arranged opposite to the crystal resonator 22, in the central area of the other principal plane opposed to the second circuit board 21b.

Moreover, a thermistor 25a is arranged between the chip resistors 35a and 35b as a temperature sensitive element, among the temperature control elements. Respective mounting terminals are integrally secured to these crystal resonator 22, chip resistors 35a and 35b, and thermistor 25a by reflowing, such as with solder.

Moreover, as shown in FIG. 3A, a thermo-conductive resin 32 is disposed between the surfaces of the chip resistors 35a and 35b, and the second circuit board 21b, and the ceramic substrate 34 is arranged on one principal plane side of the second circuit board 21b using the metallic pins 27b. A clip part provided on the aperture edge of a metallic cover 33 is inserted into an opening provided in the periphery of the first circuit board 21a, and engaged, thus joining both parts. In this way, the second circuit board 21a is accommodated.

In such a surface mounted crystal oscillator of the present invention, electricity is supplied through the power transistors of the temperature control circuit to the heat generation chip resistors 35a and 35b. As a result, the joule heat of the chip resistors 35a and 35b is conducted to the ceramic substrate 34 thus heating it. The crystal resonator 22 secured to the ceramic substrate 34 is similarly heated via the mounting terminal used for surface mounting. Moreover, the temperature of the ceramic substrate 34 arranged on the crystal resonator 22 is directly detected by the thermistor 25a to control electricity supply.

The heat of the chip resistors 35a and 35b is efficiently transmitted to the second circuit board 21b by the thermo-conductive resin 32 adhering between the one principal plane of the second circuit board 21b and the chip resistors 35a and 35b. Since the oscillating elements 25 are arranged in the part opposed to the chip resistors 35a and 35b on the other principal plane of the second circuit board 21b, their temperature dependency can be resolved.

According to such a construction, the crystal 25 oscillator can be made smaller than a conventional crystal resonator with lead wires leading out, because the crystal resonator 22 is for surface mounting. Since the heat source of the crystal resonator 22 is the chip resistors 35a and 35b and the ceramic substrate 34, the structure of the crystal oscillator can be made simpler, and the crystal oscillator can be manufactured inexpensively without the operation of winding the heating wire, compared to a conventional crystal oscillator having the heating wire wound around the thermostat.

Moreover, in the present invention, since the first circuit board 21a is for surface mounting with mounting terminals 36, a conventional metallic base is rendered unnecessary, further advancing miniaturization (shortening).

Figure 4:
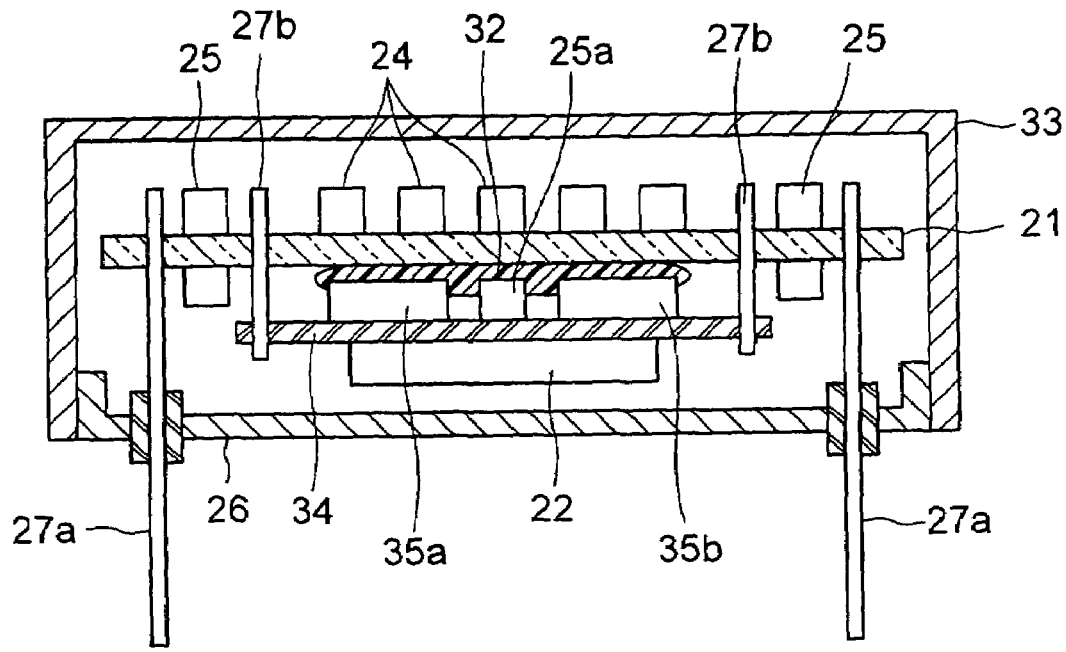
FIG. 4 is a vertical sectional view for explaining another embodiment of a constant temperature type surface mounted crystal oscillator of the present invention.

In the above embodiments of the present invention, the crystal oscillator is for surface mounting, however it may be constructed as shown in FIG. 4. That is, in the embodiment shown in FIG. 4, a circuit board 21 may be directly held by metallic pins 27a that are hermetically mounted to a metallic base 26, similarly to the conventional example. In this embodiment the second circuit board 21b shown in FIG. 3A becomes unnecessary.

Figure 5:
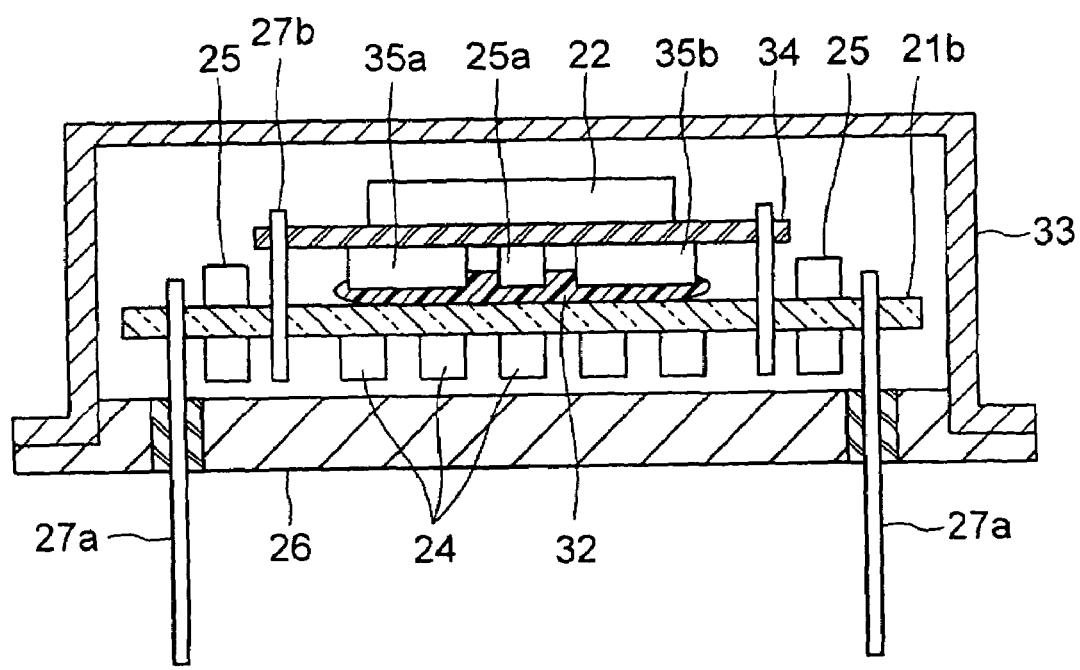
FIG. 5 is a vertical sectional view for explaining still another embodiment of a constant temperature type surface mounted crystal oscillator of the present invention.
Figure 6A:
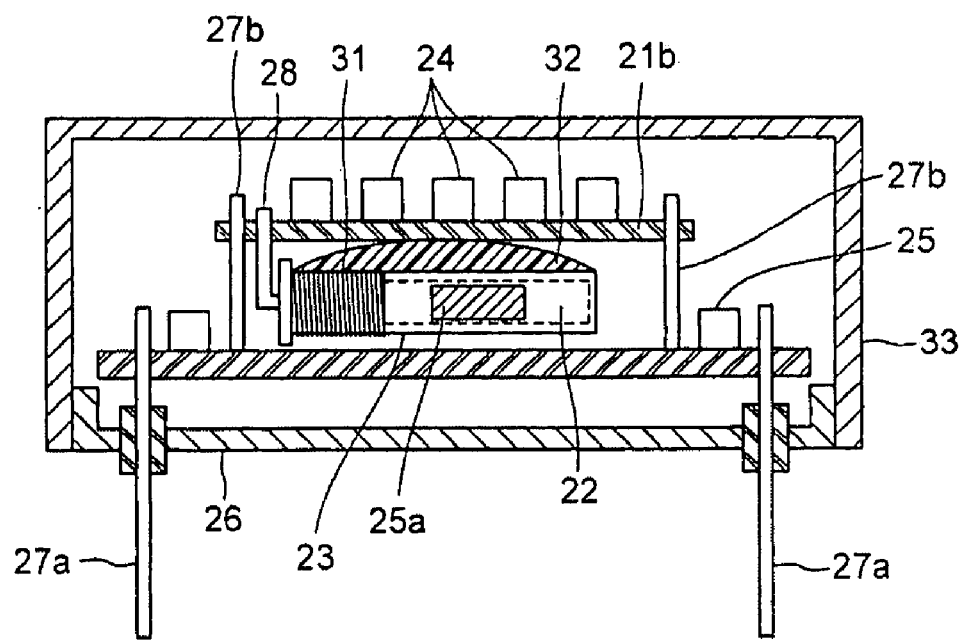
FIG. 6A is a vertical sectional view of a constant temperature type crystal oscillator.
Figure 6B:
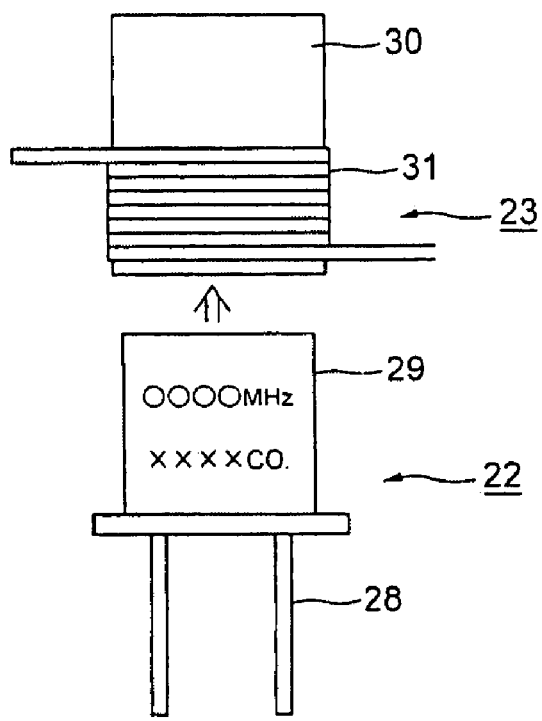
FIG. 6B is a schematic diagram showing a crystal oscillator inserted into a thermostat.

Furthermore, as shown in FIG. 5, the second circuit board 21b may be sealed off inside a metallic cover 33, with a metallic base 26 for resistance welding for example. In this case, since each of the oscillating elements 24 and the temperature control elements 25 is sealed off, they are isolated from the external atmosphere, and age deterioration characteristics can be improved.

Moreover, in the embodiments of the present invention described above, only the thermistor 25a is disposed on the other principal plane of the ceramic substrate 14 as shown in FIG. 3A. However, for example a highly heat sensitive element such as a voltage capacitive element having high temperature dependency may be disposed on the ceramic substrate to further prevent frequency fluctuations due to the temperature. Furthermore, only the chip resistors 35a and 35b for heating are disposed on one principal plane of the ceramic substrate 34 as shown in FIG. 3A. However, for example the power transistors of the temperature control circuit may be disposed for heat supply.

Furthermore, as shown in FIG. 3A, the crystal resonator 22 is provided on one principal plane of the ceramic substrate 34, and the chip resistors 35a and 35b and the thermistor 25a are provided on the other principal plane of the substrate 34. However, since the ceramic substrate 34 has excellent heat conductivity and its macroscopic heat distribution is uniform, arranging these members on the same principal plane would result in a similar effect.

What is claimed is:

1. A constant temperature type crystal oscillator comprising:
   a heat supply body that supplies heat to a crystal resonator from which a plurality of lead wires are led out, to maintain the temperature constant;
   an oscillating element that constitutes an oscillating circuit together with said crystal resonator;
   a temperature control element that constitutes a temperature control circuit for controlling the temperature of said crystal resonator; and
   a circuit board for mounting said heat supply body, said oscillating element, and said temperature control element, and through which lead wires of said crystal resonator are passed through the mounting, wherein
   said heat supply body comprises:
      a heat conducting plate which has through holes for said lead wires and is mounted on said circuit board, and which faces, and is directly thermally joined to, said crystal resonator; and
      a chip resistor for heating which is mounted on said circuit board adjacent to said heat conducting plate, and is thermally joined to said heat conducting plate, wherein said heat conducting plate has first concavities on a first pair of opposite end sides, and said chip resistors that have been thermally joined to said heat conducting plate are disposed inside said first concavities, wherein said concavities extend through the entire heat conducting plate in the direction of said through holes.

2. A constant temperature type crystal oscillator according to claim 1, which has second concavities in a second pair of opposite end sides of said heat conducting plate which are orthogonal to said first pair of opposite end sides, and power transistors that have been thermally joined to said heat conducting plate are disposed in said second concavities.

3. A constant temperature type crystal oscillator comprising:
a heat supply body that supplies heat to a crystal resonator from which a plurality of lead wires are led out, to maintain the temperature constant;
an oscillating element that constitutes an oscillating circuit together with said crystal resonator;
a temperature control element that constitutes a temperature control circuit for controlling the temperature of said crystal resonator; and
a circuit board for mounting said heat supply body, said oscillating element, and said temperature control element, and through which lead wires of said crystal resonator are passed through the mounting, wherein
said heat supply body comprises:
a heat conducting plate which has through holes for said lead wires and is mounted on said circuit board, and which faces, and is directly thermally joined to, said crystal resonator; and
a chip resistor for heating which is mounted on said circuit board adjacent to said heat conducting plate, and is thermally joined to said heat conducting plate; and
an aperture part in a center area of said heat conducting plate, and a temperature-dependent, heat sensitive element, among said oscillating element and said temperature control element, is disposed inside said aperture part so that it is thermally joined to said heat conducting plate, wherein said aperture extends through the entire heat conducting plate in the direction of said through holes.

4. A constant temperature type crystal oscillator according to claim 1, wherein said heat conducting plate is thermally joined to one principal plane of said circuit board, and said oscillating element is disposed on the other principal plane of said circuit board, which faces said heat conducting plate.

5. A constant temperature type crystal oscillator according to claim 1, wherein said thermal joining is through the medium of thermo-conductive resin.

6. A constant temperature type crystal oscillator according to claim 1, wherein a cut out, which passes through said circuit board, is provided at a position corresponding to the periphery of said heat conducting plate.

7. A constant temperature type crystal oscillator which uses a surface mounting crystal resonator, in which a surface mounting crystal resonator is mounted on a circuit board together with an oscillating element and a temperature control element, wherein said crystal resonator is arranged on a ceramic substrate, and at least a chip resistor for heat generation, and a temperature-dependent heat sensitive element are arranged on said ceramic substrate, wherein said crystal resonator is arranged on a first principal plane of said ceramic substrate, and said chip resistor and said heat sensitive element are arranged on a second principal plane of said ceramic substrate, and the second principal plane of said ceramic substrate is positioned facing one principal plane of said circuit board, and thermo-conductive resin is provided between said chip resistor and said circuit board, so that said chip resistor and said circuit board are adhered.

8. A constant temperature type crystal oscillator according to claim 7, wherein an oscillating element that constitutes an oscillating circuit is arranged on the other principal plane of said circuit board, which faces said ceramic substrate.

9. A constant temperature type crystal oscillator according to claim 7, wherein said heat sensitive element is either a temperature sensitive element or a voltage-variable capacitive element.

10. A constant temperature type crystal oscillator according to claim 7, wherein said circuit board is retained on another circuit board for surface mounting by metallic pins.

* * * * *